US006944199B2

(12) United States Patent
Acklin et al.

(10) Patent No.: US 6,944,199 B2
(45) Date of Patent: Sep. 13, 2005

(54) SEMICONDUCTOR LASER WITH LATERAL CURRENT CONDUCTION AND METHOD FOR FABRICATING THE SEMICONDUCTOR LASER

(75) Inventors: Bruno Acklin, Mountain View, CA (US); Martin Behringer, Regensburg (DE); Karl Ebeling, Ulm (DE); Christian Hanke, München (DE); Jörg Heerlein, Regensburg (DE); Lutz Korte, Feldkirchen-Westerham (DE); Johann Luft, Wolfsegg (DE); Karl-Heinz Schlereth, Burglengenfeld (DE); Werner Späth, Holzkirchen (DE); Zeljko Spika, Regensburg (DE)

(73) Assignee: Osram GmbH, Munich (DE)

( * ) Notice: Subject to any disclaimer, the term of this patent is extended or adjusted under 35 U.S.C. 154(b) by 87 days.

(21) Appl. No.: 10/460,823

(22) Filed: Jun. 12, 2003

(65) Prior Publication Data

US 2004/0028102 A1 Feb. 12, 2004

Related U.S. Application Data

(63) Continuation of application No. PCT/DE01/04687, filed on Dec. 12, 2001.

(30) Foreign Application Priority Data

Dec. 12, 2000 (DE) ........................................ 100 61 701

(51) Int. Cl.[7] ................................................. H01S 5/00
(52) U.S. Cl. ........................................... 372/46; 372/45
(58) Field of Search ...................................... 372/43–50

(56) References Cited

U.S. PATENT DOCUMENTS

| | | | | |
|---|---|---|---|---|
| 4,987,096 A | | 1/1991 | Ishikawa et al. | 438/44 |
| 5,343,486 A | | 8/1994 | Itaya et al. | 372/43 |
| 5,550,081 A | | 8/1996 | Holonyak, Jr. et al. | 438/33 |
| 5,581,571 A | * | 12/1996 | Holonyak et al. | 372/46 |

FOREIGN PATENT DOCUMENTS

| | | | | |
|---|---|---|---|---|
| EP | 0 472 212 A2 | 2/1992 | | H01S/3/085 |
| EP | 0 674 368 A2 | 9/1995 | | H01S/3/085 |

OTHER PUBLICATIONS

Maranowski, S.A. et al.: "$Al_xGa_{1-x}As$–GaAs–$In_yGa_{1-y}As$ Quantum Well Heterostructure Lasers with Native Oxide Current–Blocking Windows Formed on Metallized Devices", American Institute of Physics, Appl. Phys. Lett., vol. 64, No. 16, Apr. 18, 1994, pp. 2151–2153;.

Heerlein, J. et al.: "Highly Efficient Laterally Oxidized $\lambda$ = 950nm InGaAs–AlGaAs Single Mode Lasers", IEEE Journal of Selected Topics In Quantum Electronics, vol. 5, No. 3, May/Jun. 1999, pp. 701–706.

Maranowski, S.A. et al.: "Native–Oxide Defined $In_{0.5}(Al_xGa_{1-x})_{0.5}$ P Quantum Well Heterostructure Windows Lasers (660nm)", American Institute of Physics, Applied Physics Letters 61, No. 14, Oct. 5, 1992, pp. 1688–1690.

Caracci, S.J. et al.: "High–Performance Planar Native–Oxide Buried–Mesa Index–Guided AlGaAs–GaAs Quantum Well Heterostructure Lasers", American Institute of Physcis Letters 61, No. 3, Jul. 20, 1992, pp. 321–323.

* cited by examiner

*Primary Examiner*—Minsun Oh Harvey
*Assistant Examiner*—James Menefee
(74) *Attorney, Agent, or Firm*—Laurence A. Greenberg; Werner H. Stemer; Ralph E. Locher

(57) ABSTRACT

A semiconductor laser has a semiconductor body with first and second main areas, preferably each provided with a contact area, and also first and second mirror areas. An active layer and a current-carrying layer are formed between the main areas. The current-carrying layer has at least one strip-type resistance region, which runs transversely with respect to the resonator axis and whose sheet resistivity is increased at least in partial regions compared with the regions of the current-carrying layer that adjoin the resistance region.

17 Claims, 4 Drawing Sheets

SEMICONDUCTOR LASER WITH LATERAL CURRENT CONDUCTION AND METHOD FOR FABRICATING THE SEMICONDUCTOR LASER

CROSS-REFERENCE TO RELATED APPLICATION

This application is a continuation of copending International Application No. PCT/DE01/04687, filed Dec. 12, 2001, which designated the United States and was not published in English.

BACKGROUND OF THE INVENTION

Field of the Invention

The invention relates to a semiconductor laser with lateral current conduction. The laser has a semiconductor body with a first main area, a second main area, a resonator axis, and an active layer which is parallel to the resonator axis and is disposed between the first and second main areas. The semiconductor body further has first and second mirrored areas disposed essentially perpendicularly to the resonator axis.

Semiconductor lasers with lateral current-carrying capabilities are disclosed for example in IEEE, Journal of Selected Topics in Quantum Electronics, Vol. 5 No. 3 May/June 1999 which shows an edge-emitting metal clad ridge waveguide (MCRW) laser based on GaAs in whose semiconductor body a current-carrying layer is formed. The current-carrying layer contains an AlAs layer with two strip-like oxidized regions that run parallel to the radiation propagation direction in the laser or to the emission direction and are disposed symmetrically with respect to the central plane of the semiconductor laser. The configuration affects first an index guiding of the radiation field and second a concentration of the pump current onto the inner region of the active layer.

In edge-emitting lasers, non-radiating recombination processes can occur to an increased extent during operation in the vicinity of the resonator mirrors. The proportions of the pump current that are affected thereby do not contribute to the generation of the population inversion required for the laser operation, but rather lead, through generation of phonons, to the heating of the regions of the semiconductor body near the mirrors. This intensifies the degradation of the mirrors and thus reduces the service life of the semiconductor laser. Furthermore, the maximum optical output power of the laser that can be achieved is limited by non-radiating recombination processes.

Furthermore, edge-emitting semiconductor lasers of the type mentioned in the introduction generally have only a weakly pronounced mode selectivity. Therefore, undesirable higher modes can easily build up oscillations, particularly in the case of large pump powers.

SUMMARY OF THE INVENTION

It is accordingly an object of the invention to provide a semiconductor laser with lateral current conduction and a method for fabricating the semiconductor laser that overcome the above-mentioned disadvantages of the prior art devices and methods of this general type, which has improved current-carrying capabilities which, at the same time, can be fabricated in a technically simple manner.

With the foregoing and other objects in view there is provided, in accordance with the invention, a semiconductor laser. The semiconductor laser contains a semiconductor body having a first main area, a second main area, a resonator axis, an active layer disposed parallel to the resonator axis and between the first and second main areas, a first mirror area, and a second mirror area. The first and second mirror areas are disposed substantially perpendicularly to the resonator axis. At least one current-carrying layer is formed in the semiconductor body. At least one strip-type resistance region is disposed in the current-carrying layer and runs transversely with respect to the resonator axis. The strip-type resistance region has a sheet resistivity being increased at least in partial regions compared with regions of the current-carrying layer adjoining the strip-type resistance region.

The invention provides for the semiconductor body to be formed in the manner of an edge-emitting semiconductor laser with an active layer and a resonator axis parallel thereto, a first and a second mirror area, disposed essentially perpendicularly to the resonator axis, and also with at least one current-carrying layer extending from the first to the second mirror area. The active layer and the current-carrying layer are disposed between a first main area of the semiconductor body and a second main area of the semiconductor body opposite to the first main area, which are preferably each provided with a contact area.

The current-carrying layer has at least one strip-type resistance region, whose sheet resistivity is increased at least in partial regions compared with the sheet resistivity of that region of the current-carrying layer that adjoins the resistance region. The sheet resistivity is understood to be the resistance of the current-carrying layer, relative to a unit area, in the direction of the normal to the area.

Preferably, a resistance region is formed in a manner adjoining one of the two mirror areas or a respective resistance region is formed in a manner adjoining both mirrors areas. During operation, the current flow is advantageously reduced or suppressed on account of the increased electrical resistance of the current-carrying layer in the vicinity of the mirror planes. As a result, the non-radiating processes that usually occur to an increased extent in proximity to the mirrors are reduced and heating of the mirror areas and more rapid aging associated therewith are thus reduced. A further advantage of the invention is that the internal quantum efficiency of the laser is increased as a result of the reduction of the non-radiating processes.

In a further advantageous embodiment of the invention, a strip-like resistance region is formed in the current-carrying layer such that the sheet resistivity is increased primarily in the partial regions that are remote from the resonator axis. In the vicinity of the resonator axis, the sheet resistance is preferably unchanged relative to the adjoining regions of the current-carrying layer. By virtue of this structure, the laser amplification is concentrated onto the resonator axis and a mode diaphragm is thus created, which advantageously increases the mode selectivity of the laser.

The sheet resistivity of the resistance region or regions in the current-carrying layer is preferably increased to an extent such that the regions constitute an electrical insulator and an efficient suppression of the current flow is thereby ensured in these regions.

It is furthermore preferably the case that the active layer and the current-carrying layer are disposed closely adjacent to one another. This prevents proportions of pump current from migrating underneath the resistance regions of the current-carrying layer as a result of current expansion.

In the case of resistance regions near mirrors, protection against degradation is thus afforded particularly to those regions of the mirrors which lie near the active layer, at which the main proportions of the radiation field are reflected or coupled out and which are therefore of particular significance for the performance of the laser.

In an advantageous development of the invention, the resistance regions of the current-carrying layer contain oxide compounds of the material from which the current-carrying layer is formed or oxide compounds derived therefrom. Such oxide layer regions are distinguished by good electrical insulation properties and can be fabricated without a high outlay from a technical standpoint.

The invention is not subject to any fundamental restrictions with regard to the semiconductor material. It is suitable in particular for semiconductor systems based on GaAs or InP, in particular for InGaAs, AlGaAs, InGaAlAs, InGaP, InGaAsP or InGaAlP.

A fabrication method according to the invention begins with the fabrication of a semiconductor sequence, corresponding to the later laser structure, according to a customary method. By way of example, the semiconductor layers may be grown epitaxially on a suitable substrate. The current-carrying layer is also applied during this step, although initially it has a homogeneous sheet resistance.

In the next step, the semiconductor layer sequence is patterned into strips in a comb-like manner.

This is followed by a partial lateral oxidation of the current-carrying layer in order to form the strip-type resistance regions and the singulation of the comb-like semiconductor strips into the individual semiconductor bodies. During the partial lateral oxidation, a partial region of the current-carrying layer is oxidized, the partial region, during the oxidation, growing in the plane of the current-carrying layer from the side area into the semiconductor body, that is to say in the lateral direction.

During the formation of resistance regions near mirrors, it is advantageously the case in this method that no alterations are made to the mirror areas themselves which might impair the thermal coupling of the mirrors to the semiconductor body or promote the heating of the mirrors during operation.

In a preferred refinement of the invention, the partial lateral oxidation of the current-carrying layer takes place before the singulation. The oxidation is thus advantageously possible in the wafer composite, thereby reducing the fabrication outlay. In this case, the growth direction of oxide regions during the partial lateral oxidation is preferably directed from both side areas of the semiconductor strips toward the center of the current-carrying layer.

A further refinement of the invention consists in carrying out the partial lateral oxidation after the singulation. This refinement of the invention is particularly advantageous in the case of broad-strip lasers, which have a laterally widely extended active layer. Resistance regions of the current-carrying layer near mirrors can thus also be oxidized from the mirror side, as a result of which excessively deep penetration of the oxidized regions into the semiconductor body can be avoided.

In a preferred development of the invention, the fabrication method is continued with the formation of the contact areas on the corresponding main areas of the semiconductor body thus formed.

In a further step, the mirror areas may be provided with an optical coating on one or both sides, for example with a layer for improving the reflection properties or some other protective layer.

Other features which are considered as characteristic for the invention are set forth in the appended claims.

Although the invention is illustrated and described herein as embodied in a lateral current-carrying semiconductor laser and a method for fabricating the semiconductor laser, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
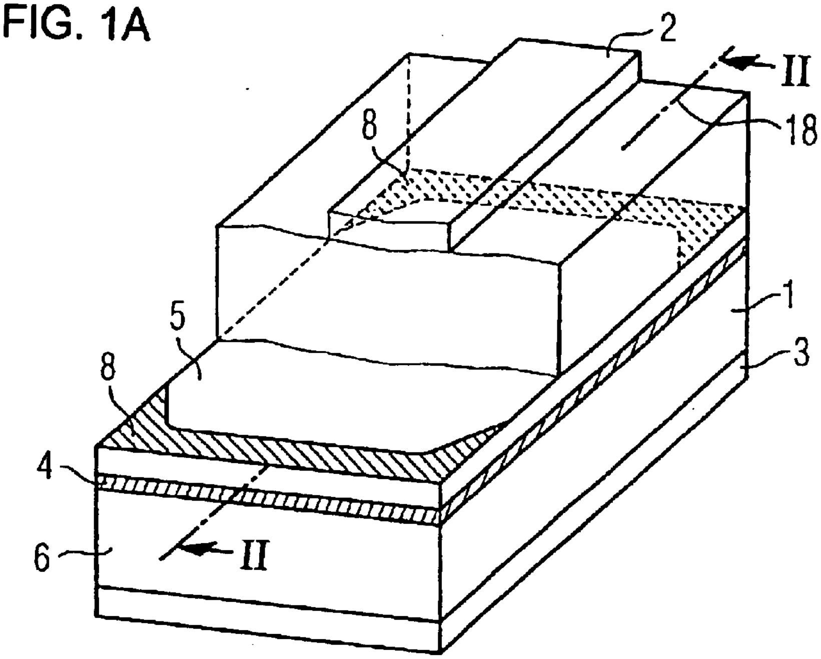
FIG. 1A is a diagrammatic, perspective partial sectional view of a first exemplary embodiment of a semiconductor laser according to the invention.

In all the figures of the drawing, sub-features and integral parts that correspond to one another bear the same reference symbol in each case. Referring now to the figures of the drawing in detail and first, particularly, to FIG. 1A thereof, there is shown a semiconductor laser that has a semiconductor body 1, which is provided with a first contact area 2 and a second contact area 3 at the two opposite main areas. An active layer 4 is formed in-between parallel to the main areas 2, 3. In the active layer 4, during operation, a population inversion is generated between valence and conduction bands, which serves for radiation generation or amplification by stimulated emission.

The material InGaAs/AlGaAs is used as a semiconductor material, the active layer 4 being formed as a quantum well structure. A current-carrying layer 5 in the form of an $Al_xGa_{1-x}As$ layer ($0 \leqq x \leqq 1$, preferably $0.9 \leqq x \leqq 1.0$) is disposed between the active layer 4 and the contact area 2, parallel to the active layer 4.

The front side and the rear side of the semiconductor body 1 form end mirrors 6, 7 of the laser resonator. A respective resistance region 8 is formed in a manner adjoining the mirror areas 6, 7, which resistance region contains aluminum oxide and is electrically insulating, i.e. has negligible electrical conductivity.

Figure 1B:
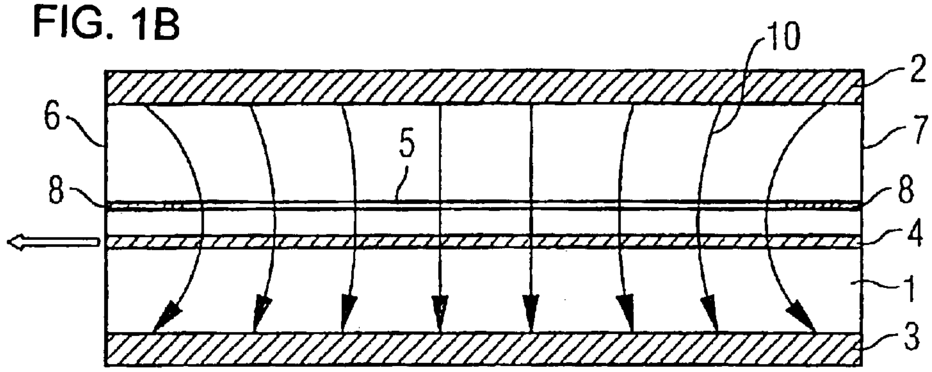
FIG. 1B is a sectional view of the semiconductor laser taken along the line II—II shown in FIG. 1A.

FIG. 1B illustrates the effect of the insulating regions 8 in a sectional view. In this case, the sectional plane is perpendicular to the semiconductor layers and runs centrally through the semiconductor body along a resonator axis 18.

During operation, a pump current 10 is injected into the semiconductor body 1 via the contact areas 2 and 3 and flows essentially perpendicularly to the active layer plane 4 through the semiconductor body 1. Over a wide region in the center of the sectional view, the pump current flows on a direct path from the contact area 2 to the contact area 3. In the vicinity of the mirror planes 6 and 7, such a current flow is prevented by the insulating resistance regions 8, so that the pump current 10 is concentrated in the direction of the central region and kept away from the mirror planes 6, 7. As a result, the radiationless recombination processes that occur to an increased extent in proximity to the mirrors are suppressed and the associated heating of the mirror areas is prevented.

Figure 2:
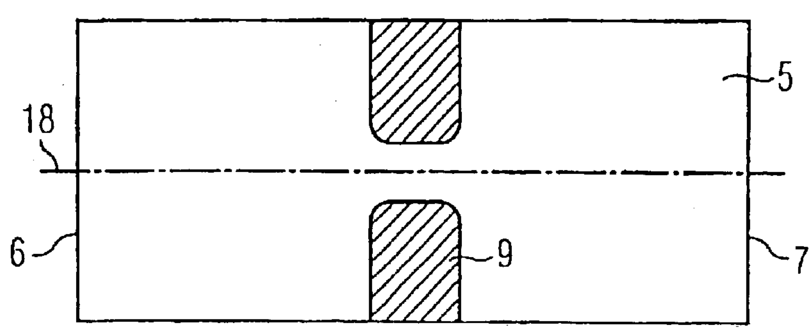
FIG. 2 is a sectional view of a second exemplary embodiment of the semiconductor laser according to the invention.

FIG. 2 shows a sectional view of the current-carrying layer of a further exemplary embodiment of the invention. The general construction corresponds to the semiconductor laser shown in FIG. 1A. In contrast thereto, a strip-type resistance region 9 running perpendicularly to the resonator axis 18 is formed centrally between the two mirror areas 6 and 7, which resistance region 9 is oxidized and thus electrically insulating in the partial regions shown hatched. A partial region surrounding the resonator axis 18 was omitted from this.

Within the resistance region 9, the pump current and thus also the laser amplification are concentrated locally on the resonator axis 18 and an active mode diaphragm is thus formed. Moreover, a passive mode diaphragm is also formed by the difference in refractive index between the oxidized and the non-oxidized regions of the current-carrying layer 5.

As a result of this mode diaphragm structure, the fundamental mode propagating in the vicinity of the resonator axis experiences a significantly larger amplification than higher modes with a larger lateral extent. The mode selectivity of the semiconductor laser is thus advantageously increased.

More widely, continuous strip-type resistance regions may also be formed for mode selection purposes, which resistance regions enable, by way of example, a selection of specific longitudinal modes. It goes without saying that individual aspects of the exemplary embodiments shown can also be combined.

Figure 3A:
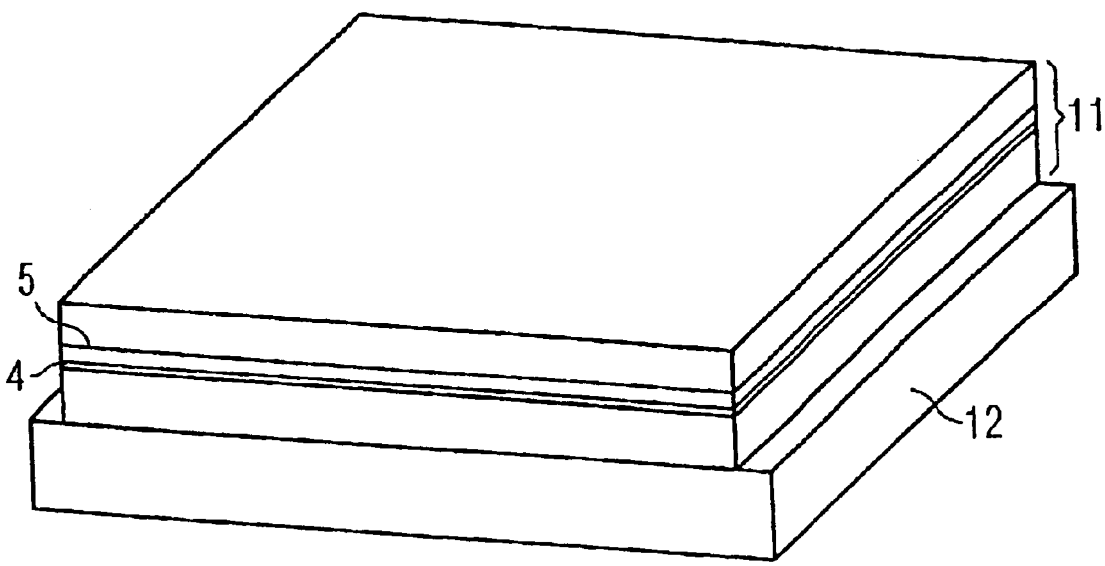
FIGS. 3A–3D are perspective views a first exemplary embodiment of a fabrication method according to the invention.

The fabrication method illustrated schematically in FIGS. 3A–3D on the basis of four intermediate steps begins with the epitaxial fabrication of a semiconductor layer sequence 11 on an epitaxy substrate 12, FIG. 3A. The epitaxial fabrication is effected according to the customary methods known to the person skilled in the art.

In this case, the active layer 4 is formed in the semiconductor layer sequence 11 and the current-carrying layer 5 is applied in the form of a homogeneous, oxidizable semiconductor layer. In the case of the AlGaAs/InGaAs material system, an $Al_xGa_{1-x}As$ layer ($0 \leqq x \leqq 1$) with a thickness of between 5 and 100 nm, by way of example, is suitable for this.

Figure 3B:
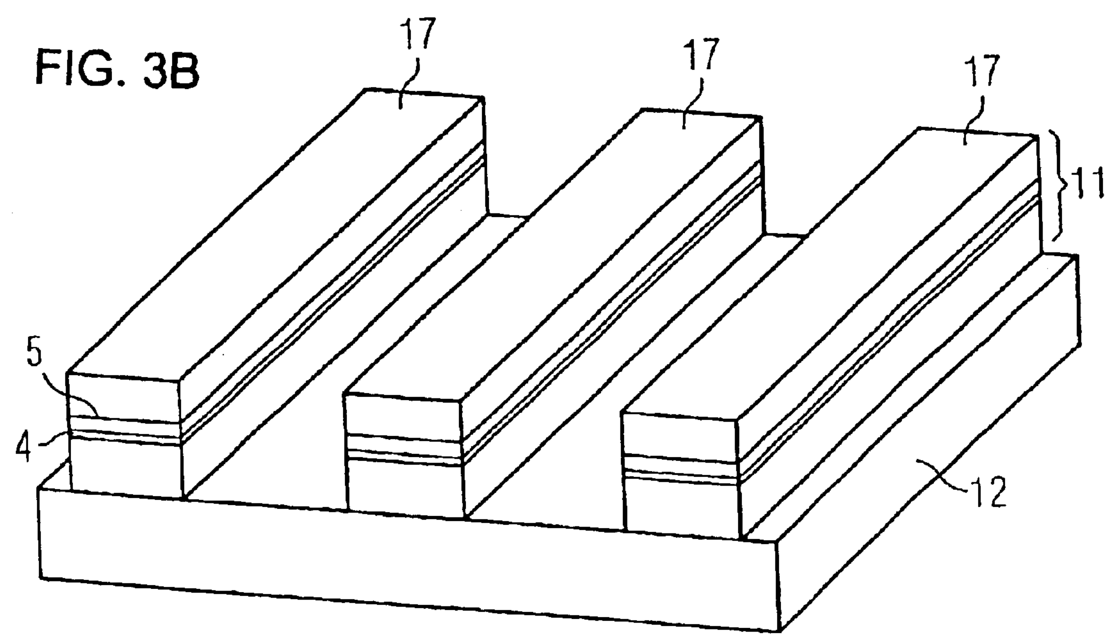

In the next step, FIG. 3B, the semiconductor layer sequence 11 is patterned into comb-like semiconductor strips 17. In this case, the strip width is preferably between 1 $\mu$m and 400 $\mu$m. This patterning can be affected by trench etching, for example.

Figure 3C:
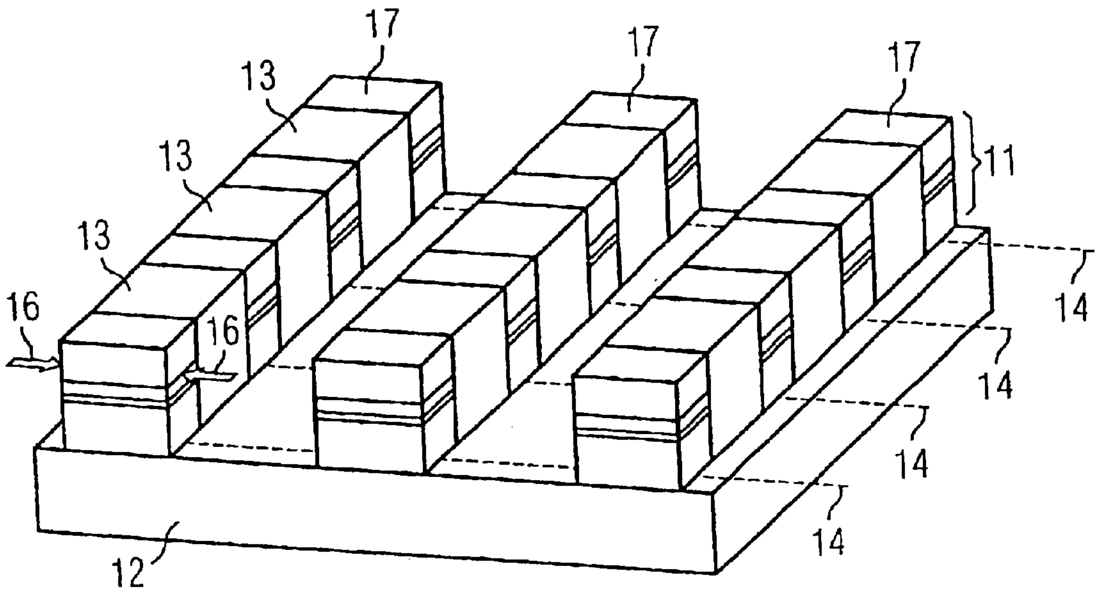

In a further step, FIG. 3C, those regions which form the resistance regions 8 and 9, respectively, in the singulated semiconductor bodies are subjected to partial lateral oxidation.

To that end, first a suitable mask 13, for example an oxide or nitride mask 13, is applied to the semiconductor strips 17, which mask protects the underlying material from the oxide attack. The side wall regions of the semiconductor strips 17 corresponding to the insulating regions 8 and 9, respectively, remain uncovered.

Afterward, the semiconductor strips 17 are exposed to a suitable oxidizing agent. For AlGaAs semiconductor systems, a water vapor atmosphere at elevated temperature may be used for this purpose. In this case, in the current-carrying layer, aluminum-oxide-containing zones grow during the duration of action of the oxidizing agent in the direction marked by arrows 16 in FIG. 3C from the respective side walls of the semiconductor strips 17 toward the strip center.

In order to form contiguous resistance regions, the oxidation is carried out until the oxide zones propagating from both side walls form a continuous area. In order to fabricate resistance regions 9 in accordance with FIG. 2, as an alternative, the oxidation is ended earlier, so that the oxide layers propagating from both side walls do not make contact with one another.

Figure 3D:
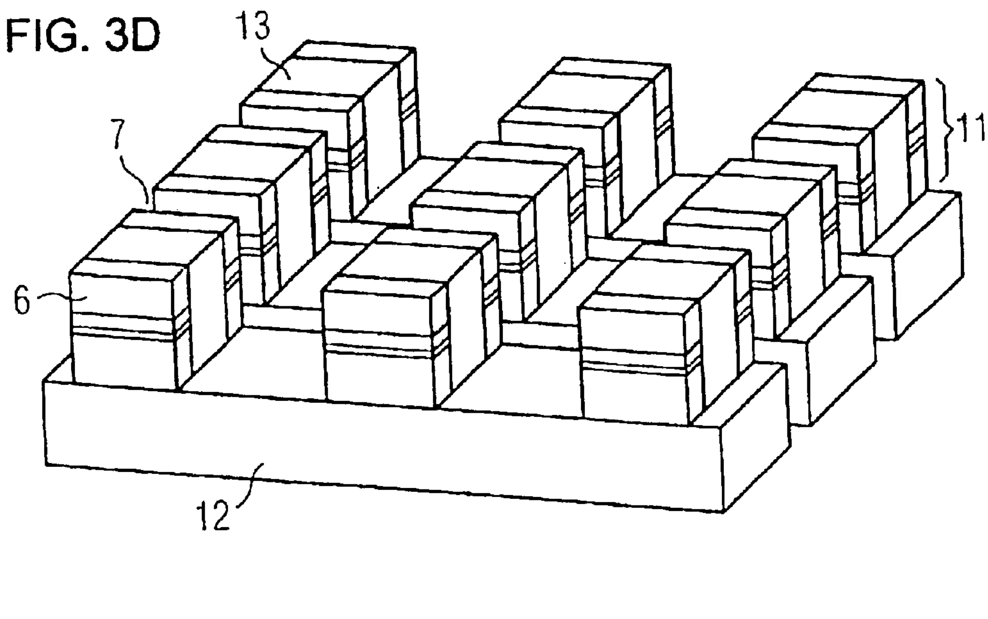

After this step, the semiconductor strips 17 are singulated by breaking, FIG. 3D. The illustration in FIG. 3D only shows the first singulation step, in which break edges 14 run transversely with respect to the semiconductor strips 17. The semiconductor bodies respectively disposed on a strip of the substrate 12 can then be singulated in a further step.

In the first singulation step, the break edges 14 are disposed such that they each run through the oxide zones. The break areas 14 (cleavage faces) thus formed form the mirror areas 6 and 7 of the semiconductor laser. As a result of the configuration of the break edges 14 within the oxide zones, a respective oxidized, electrically insulating resistance region in the current-carrying layer 5 adjoins the mirror areas and prevents a current flow in proximity to mirrors during operation.

In order to fabricate the resistance regions 9 in accordance with FIG. 2, the break edges 14 are disposed outside the oxide zones or further oxide zones are formed between the break edges 14.

Figure 4A:
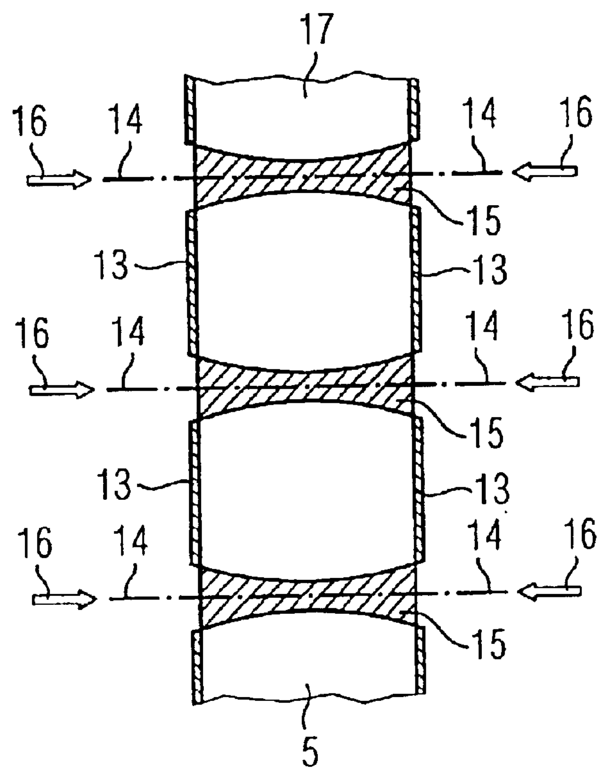
FIGS. 4A–4B are schematic illustrations of an intermediate step in the first and a second exemplary embodiment of a fabrication method according to the invention.
Figure 4B:
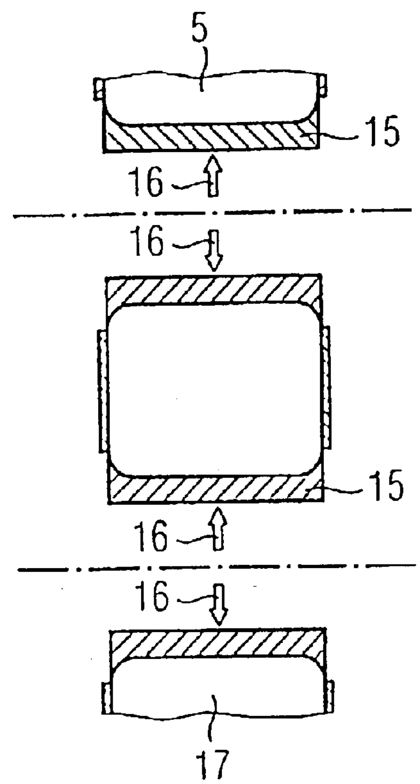

FIGS. 4A and 4B illustrate, in two alternatives, a section through the semiconductor strips 17 in the plane of the current-carrying layer after the partial lateral oxidation. The partial lateral oxidation was affected before the singulation in FIG. 4A, and after the singulation in FIG. 4B.

During the partial lateral oxidation before the singulation, FIG. 4A, oxide regions 15 grow essentially in the direction of the arrows 16 from the side areas toward the central axis of the semiconductor strips 17. The oxidation direction 16 is thus also predominantly parallel to the break edges 14 for the subsequent singulation. The advantage of this method is that the partial lateral oxidation can be affected in the wafer composite and the fabrication outlay is thus reduced.

During the partial lateral oxidation after the singulation, FIG. 4B, the oxide regions 15 grow primarily perpendicularly to the break edges or cleavage faces. A continuous oxide strip 15 having the same thickness thus forms along the break areas. The thickness of the oxide strip 15 can be set by the duration of the oxidation step. This method is particularly advantageous for semiconductor lasers with a large lateral extent such as, for example, broad-strip laser or laser arrays.

The explanation of the invention on the basis of the exemplary embodiments described is not, of course, to be understood as a restriction of the invention thereto. In particular, the invention relates not only to laser oscillators but also to laser amplifiers and superradiators, in this case the semiconductor body having at most one mirror layer. The other interfaces of the semiconductor body that serve for coupling out radiation may be provided with a suitable coating, for example an antireflection coating.

We claim:

1. A semiconductor laser, comprising:

a semiconductor body having a first main area, a second main area, a resonator axis, an active layer disposed parallel to said resonator axis and between said first and second main areas, a first mirror area, and a second mirror area, said first and second mirror areas disposed substantially perpendicularly to said resonator axis;

at least one current-carrying layer formed in said semiconductor body; and at least one strip-type resistance region disposed in said current-carrying layer and running transversely with respect to said resonator axis, said strip-type resistance region having a sheet resistivity being increased at least in partial regions compared with regions of said current-carrying layer adjoining said strip-type resistance region;

said sheet resistivity of said strip-type resistance region being lower in a first partial region than in a second partial region, said first partial region being at a shorter distance from said resonator axis than said second partial region.

2. The semiconductor laser according to claim 1, wherein said strip-type resistance region is formed in a manner adjoining one of said first and second mirror areas.

3. The semiconductor laser according to claim 1, wherein said strip-type resistance region is formed in a manner adjoining both of said first and second mirror areas.

4. The semiconductor laser according to claim 1, wherein said strip-type resistance region is electrically insulating in its entirety or in partial regions.

5. The semiconductor laser according to claim 1, wherein the semiconductor laser has a semiconductor material based on a material selected from the group consisting of GaAs, InP, InGaAs, AlGaAs, InGaP, InGaAsP and InGaAlP.

6. The semiconductor laser according to claim 1, further comprising a contact area formed on said first main area.

7. The semiconductor laser according claim 6, further comprising a further contact area formed on said second main area.

8. The semiconductor laser according to claim 1, wherein said current-carrying layer is disposed in a vicinity of said active layer.

9. The semiconductor laser according to claim 1, wherein said strip-type resistance region contains an oxide of a material of said current-carrying layer.

10. The semiconductor laser according to claim 1, wherein said current-carrying layer is formed of a semiconductor material selected from the group consisting of GaAs, InP, InGaAs, AlGaAs, InGaAlAs, InGaP, InGaAsP and InGaAlP.

11. A method for fabricating a semiconductor laser, which comprises the steps of:

fabricating a semiconductor layer sequence having a current-carrying layer;

patterning the semiconductor layer sequence into comb-shaped semiconductor strips;

carrying out a partial lateral oxidation of the current-carrying layer for forming at least one resistance region; and singling the comb-shaped semiconductor strips into separate semiconductor bodies, each semiconductor body forming a semiconductor laser according to claim 1.

12. The method according to claim 11, which further comprises performing the singling by breaking.

13. The method according to claim 12, which further comprises forming a respective break edge to run through an oxidized region.

14. The method according to claim 11, which further comprises performing the singling step after performing the partial lateral oxidation step.

15. The method according to claim 11, which further comprises performing the singling step before performing the partial lateral oxidation step.

16. The method according to claim 11, which further comprises forming contact areas on main areas of the semiconductor layer sequence.

17. The method according to claim 11, which further comprises optically coating the semiconductor layer sequence for forming mirror areas.

* * * * *